United States Patent
Daniel et al.

(10) Patent No.: US 8,247,883 B2
(45) Date of Patent: Aug. 21, 2012

(54) PRINTING SHIELDED CONNECTIONS AND CIRCUITS

(75) Inventors: Jurgen H. Daniel, San Francisco, CA (US); Tse Nga Ng, Palo Alto, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 384 days.

(21) Appl. No.: 12/328,694

(22) Filed: Dec. 4, 2008

(65) Prior Publication Data

US 2010/0140673 A1      Jun. 10, 2010

(51) Int. Cl.
    *H01L 23/522*       (2006.01)
(52) U.S. Cl. ......... 257/508; 257/E23.018; 257/E21.174; 438/763
(58) Field of Classification Search .................. 257/259, 257/508, 659, 664, E21.114, E21.174, E21.464, 257/E23.018, E23.166; 438/761, 763, 778, 438/780
    See application file for complete search history.

(56) References Cited

U.S. PATENT DOCUMENTS

| | | | | |
|---|---|---|---|---|
| 4,609,845 A * | 9/1986 | Soni et al. | ...................... | 310/357 |
| 5,889,871 A * | 3/1999 | Downs, Jr. | ..................... | 381/173 |
| 6,255,730 B1 * | 7/2001 | Dove et al. | .................... | 257/728 |
| 6,573,597 B2 * | 6/2003 | Dove et al. | ........................ | 257/728 |
| 2002/0101723 A1 * | 8/2002 | Bertin et al. | .................. | 361/736 |
| 2005/0035771 A1 * | 2/2005 | Yakabe et al. | ................ | 324/658 |
| 2007/0110893 A1 * | 5/2007 | Lennon et al. | ............... | 427/96.1 |
| 2008/0230252 A1 * | 9/2008 | Cheng | ....................... | 174/105 R |

* cited by examiner

*Primary Examiner* — Wensing Kuo
(74) *Attorney, Agent, or Firm* — Blakely Sokoloff Taylor & Zafman, LLP

(57) ABSTRACT

An embodiment is a method and apparatus to construct a shielded cable, wire, or circuit. A first insulator layer is deposited on a first conductor or semiconductor layer. A second conductor or semiconductor layer is deposited on the first insulator layer. A second insulator layer is deposited on the first insulator layer. The second insulator layer covers the second conductor or semiconductor layer and defines a shielded region. A third conductor or semiconductor layer is deposited on the first conductor or semiconductor layer. The third conductor or semiconductor layer covers the first and second insulator layers. At least one of the first, second, and third conductor or semiconductor layers, and the first and second insulator layers is deposited by printing.

24 Claims, 6 Drawing Sheets

PRINTING SHIELDED CONNECTIONS AND CIRCUITS

STATEMENT REGARDING FEDERALLY SPONSORED RESEARCH AND DEVELOPMENT

This invention was made with Government support under Contract No. W81XWH-08-C-0065 awarded by the Defense Advanced Research Projects Agency (DARPA). The Government has certain rights in this invention.

TECHNICAL FIELD

The presently disclosed embodiments are directed to the field of electronics, and more specifically, to shielded cables for electronic components and devices.

BACKGROUND

Electronic transmission lines that connecting electronic devices or components may be affected by electromagnetic interferences (EMI). The EMI may cause electronic noise that distorts the signal and decreases sensitivity. To reduce the effects of EMI and other undesirable noises, coaxial cables are usually used as transmission lines.

A coaxial cable is one that consists of two conductors that share a common axis. The inner conductor is typically a straight wire, either solid or stranded and the outer conductor is typically a shield that might be braided or a foil. Coaxial cables are typically characterized by the impedance and cable loss. The characteristic impedance is determined by the size and spacing of the conductors and the type of dielectric used between them. A coaxial cable provides protection of signals from external electromagnetic interference, and effectively guides signals with low emission along the length of the cable. Although coaxial cables have been used to provide shielded connections for electronic devices and components, such shielded connections do not exist for printed electronic circuits.

SUMMARY

One disclosed feature of the embodiments is a method and apparatus to construct a shielded cable, connection, wire, or circuit. A first insulator layer is deposited on a first conductor or semiconductor layer. A second conductor or semiconductor layer is deposited on the first insulator layer. A second insulator layer is deposited on the first insulator layer. The second insulator layer covers the second conductor or semiconductor layer and defines a shielded region. A third conductor or semiconductor layer is deposited on the first conductor or semiconductor layer. The third conductor or semiconductor layer covers the first and second insulator layers. At least one of the first, second, and third conductor or semiconductor layers, and the first and second insulator layers is deposited by printing.

One disclosed feature of the embodiments is a circuit including a sensor, an input circuit, and a shielded cable. The sensor generates a sensing signal. The input circuit reads the sensing signal. The shielded cable connects the sensor to the input circuit. The shielded cable includes a first conductor or semiconductor layer, a first insulator layer deposited on the first conductor or semiconductor layer, a second conductor or semiconductor layer deposited on the first insulator layer, a second insulator layer deposited on the first insulator layer, and a third conductor or semiconductor layer deposited on the first conductor or semiconductor layer. The second insulator layer covers the second conductor or semiconductor layer and defines a shielded region. The third conductor or semiconductor layer covers the first and second insulator layers. At least one of the first, second, and third conductor or semiconductor layers, and the first and second insulator layers is deposited by printing

BRIEF DESCRIPTION OF THE DRAWINGS

Embodiments may best be understood by referring to the following description and accompanying drawings that are used to illustrate various embodiments. In the drawings.

DETAILED DESCRIPTION

Figure 1:
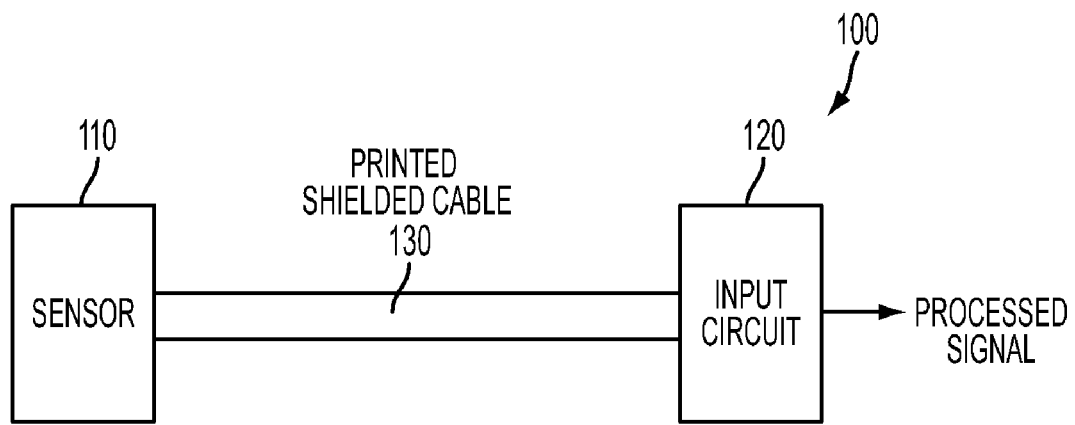
FIG. 1 is a diagram illustrating a circuit using a printed shielded cable according to one embodiment.

One disclosed feature of the embodiments is a technique to construct a shielded cable, connection, wire, or circuit. A first insulator layer is deposited on a first conductor or semiconductor layer. A second conductor or semiconductor layer is deposited on the first insulator layer. A second insulator layer is deposited on the first insulator layer. The second insulator layer covers the second conductor or semiconductor layer and defines a shielded region. A third conductor or semiconductor layer is deposited on the first conductor or semiconductor layer. The third conductor or semiconductor layer covers the first and second insulator layers. At least one of the first, second, and third conductor or semiconductor layers, and the first and second insulator layers is deposited by printing.

One disclosed feature of the embodiments is a circuit including a sensor, an input circuit, and a shielded cable. The sensor generates a sensing signal. The input circuit reads the sensing signal. The shielded cable connects the sensor to the input circuit. The shielded cable includes a first conductor or semiconductor layer, a first insulator layer deposited on the first conductor or semiconductor layer, a second conductor or semiconductor layer deposited on the first insulator layer, a second insulator layer deposited on the first insulator layer, and a third conductor or semiconductor layer deposited on the first conductor or semiconductor layer. The second insulator layer covers the second conductor or semiconductor layer and defines a shielded region. The third conductor or semiconductor layer covers the first and second insulator layers. At least one of the first, second, and third conductor or semiconductor layers, and the first and second insulator layers is deposited by printing.

One disclosed feature of the embodiments may be described as a process which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a program, a procedure, a method of manufacturing or fabrication, etc. One embodiment may be described by a schematic drawing depicting a physical structure. It is understood that the schematic drawing illustrates the basic concept and may not be scaled or depict the structure in exact proportions.

One disclosed feature of the embodiments is a method and apparatus to fabricate shielded connections or shielded components in an all-additive method using printing. The connection or component is shielded by layers made of electrically conducting, semiconducting, insulating or optical materials. Using a printing technique (e.g., jet printing, screen printing, offset printing, gravure printing, flexographic printing, pad printing, aerosol printing, dip-pen printing) to deposit layers of materials provides for simple and efficient control of layer thickness and varying the material type. The shielded component may be a conductor carrying electrical or optical signal, an active component, a switching device, a circuit, or any component that needs shielding. The deposition techniques may be all printing or a combination of printing and conventional methods such as sputtering followed by patterning. The shielded layer or component may be covered or encapsulated by alternating layers of conducting, semiconducting, and insulating materials. The printed shielded cable is used in applications where printed circuits are used.

FIG. 1 is a diagram illustrating a circuit 100 using a shielded cable according to one embodiment. The circuit 100 includes a sensor 110, an input circuit 120, and a printed shielded cable 130. Note that the circuit 100 may include more or less than the above components. The sensor 110 and the input circuit 120 may be printed circuits on a circuit board.

The sensor 110 may be any sensor. It may be an environmental sensor such as a pressure sensor, a humidity sensor, a temperature sensor, etc. It may be an electrical sensor that senses an electrical quantity such as current, voltage, impedance, etc. It may be a transducer that converts a form of energy (e.g., mechanical) to electrical sensing signal. It sends the sensing signal to the input circuit 120 via the printed shielded cable 130.

The input circuit 120 may be any suitable input stage circuit. It reads the sensing signal and processes the signal. It may include an amplifier circuit, a signal conditioner, a filter, an analog-to-digital converter (ADC), an instrumentation amplifier, etc.

The printed shielded cable 130 connects the sensor 110 to the input circuit 120. It may carry the sensing signal. The sensing signal is shielded from radio frequency interference (RFI) or electromagnetic interference (EMI). The printed shielded cable 130 may include component or components that process the sensing signal or provide additional functionality to the input circuit 120.

The embodiment shown in FIG. 1 illustrates an example of a printed shielded cable that carries a sensing signal from a sensor to an input circuit. In another embodiment, the circuit 100 may include an output circuit and an output device and the printed shielded cable 130 may carry a command or control signal from the output circuit to the output device. Yet, in another embodiment, the printed shielded cable 130 may carry data signal from a source circuit to a destination circuit. The source circuit may be any circuit that drives a signal and the destination circuit is any circuit that receives the signal. The printed shielded cable 130 may be used within a printed circuit to reduce interference with a neighboring signal line when the lines are in close proximity. The resistance or impedance of the connection may be adjusted to a certain desirable value by varying the resistance of the printed lines and by varying the thickness or the material(s) of the insulator layers in the printed shielded cable 130.

Figure 2:
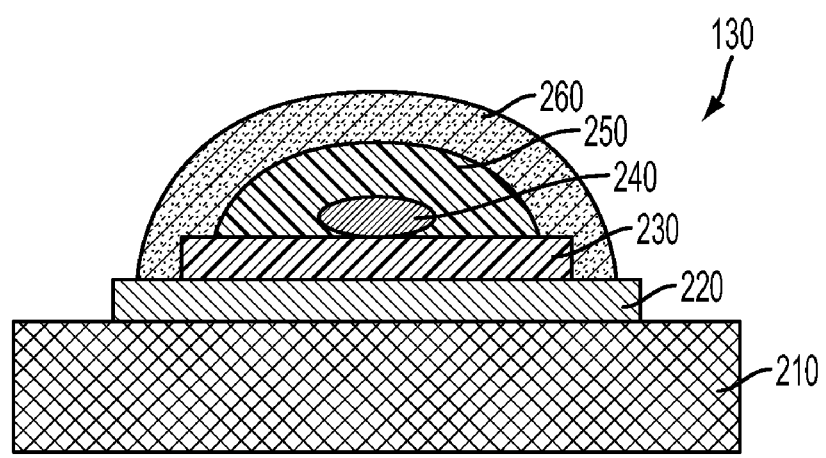
FIG. 2 is a diagram illustrating cross section of a printed shielded cable according to one embodiment.

FIG. 2 is a diagram illustrating cross section of the printed shielded cable 130 shown in FIG. 1 according to one embodiment. The printed shielded cable 130 includes a substrate 210; first, second, and third conductor or semiconductor layers 220, 240, and 260; and first and second insulator layers 230 and 250.

The substrate 210 may be any suitable substrate. It may be an insulator such as epoxy resin (e.g., FR-4), or glass or a flexible substrate such as Kapton™, Mylar™, polyethylene naphthalate (PEN), paper or other material used for flexible electronics. It may be a printed circuit board to which electronic components such as the sensor 110 and the input circuit 130 are attached. In one embodiment, the sensor 110 and input circuit 130 may be deposited by a printing method.

The first conductor or semiconductor layer 220 is deposited on the substrate 210. The first insulator layer 230 is deposited on the first conductor or semiconductor layer 220. The second conductor or semiconductor layer 240 is deposited on the first insulator layer 230. The second conductor or semiconductor layer 240 may carry the sensing signal or the signal between the sensor 110 and the input circuit 130, or between a source component and a destination component. It may also be an active component such as a switching device. The second insulator layer 250 is deposited on the first insulator layer 230 and covers, or encapsulates, the second conductor or semiconductor layer 240. The second insulator layer 250 thus defines a shielded region in which the second conductor or semiconductor layer 240 or a component is shielded from RFI or EMI. The third conductor or semiconductor layer 260 is deposited on the first conductor or semiconductor layer 220 and covers, or encapsulates, the first and second insulator layers 230 and 250.

At least one of the layers 220, 230, 240, 250, and 260 is deposited on the layer or layer(s) below it by printing, such as jet printing. They may also be deposited by other methods. For example, conductor or semiconductor layers 220 and 240 may be deposited by sputtering and then patterned using digital lithography, photolithography, or laser ablation, etc. The insulator layers 230 and 250 may be deposited by lamination, doctor blading, screen printing, or spray coating, etc. and then patterned using an appropriate patterning or etching technique such as laser ablation. Any of these depositing methods may be combined or mixed in any appropriate order. When a conductor layer is used as a common ground plane, it may not be patterned. In one embodiment, all of the above layers are deposited by printing (e.g., jet printing).

At least one of the first, second, and third conductor or semiconductor layers 220, 240, and 260 may be made of a printed organic conductor, such as polyaniline, polyacetylene, polypyrrole, a polymer mixture of two ionomers such as Poly(3,4-ethylenedioxythiophene) poly(styrenesulfonate) (PEDOT: PSS), sintered metal nano-particles, carbon nanotubes, metal nanowires, metal precursor material (such as a metal salt) and a printed plating seed material (e.g., palladium nano-particles or reducing agents) that is subsequently plated up (e.g. by copper, gold or nickel electro- or electroless plating). Examples of conductive inks are the Clevios™ organic conductor inks from H.C. Starck of Goslar, Germany, the silver or gold nanoparticle inks from NanoMas Technologies, Inc., of Vestal, N.Y., or the conductive silver inks from Ink-Tec, Co., Ltd. of Korea.

At least one of the first and second insulator layers 230 and 250 is made from one of printed polymer solutions, printed polymer particles (optionally subsequently fused), precursors for inorganic insulators, such as silicon dioxide precursors, silicones and polysilsesquioxanes, inorganic particles such as titanium dioxide or zirconium dioxide (deposited from solution), hybrid organic-inorganic insulators, etc. The insulator layer 230 and/or 250 may be a polymer such as Polyvinylidene Fluoride (PVDF) or Polyvinylidene Fluoride-trifluoroethylene (PVDF-TrFE) copolymer. It may be also of a piezoelectric version of PVDF and PVDF-TrFE, which may be achieved by appropriate thermal treatment and electrical poling of the polymers. This may be useful for sensor cables that are sensitive to local pressure or bending (similar to conventional piezo-cables).

The insulator layers 230 or 250 may also be deposited by a printing technique such as jet printing. Both layers may be made of the same material or different materials. Examples of the materials for the insulator layers 230 or 250 may include low dielectric constant (k) polymer such as Teflon AF, Cytop, silicon dioxide precursor, silsesquioxane (e.g. methylated polysilsesquioxane), etc. In one example, a low-k material is a materials with a dielectric constant of less than 5. In another Other materials may include Polyvinylcinnamte (PVCN), polyvinylstyrylacrylate (PVSA), epoxy resin such as SU-8, polyvinylphenol, Polymethyl-methacrylate (PMMA), spin-on glass, BCB™, SILK™, FLARE™. The insulator material also includes porous organic or inorganic materials such as xerogels and aerogels, as well as evaporated materials such as Parylene. The insulator layers 230 or 250 may often be a low-k material such as Teflon which is rather hydrophobic. Printing liquids onto hydrophobic materials may be difficult. However, it is possible to print phase-change materials such as waxes or to print ultraviolet (UV) curable inks that are rapidly UV cured upon contact with the substrate. If these materials are more hydrophilic, they may act as pinning structures for subsequently deposited materials such as solutions of conducting materials. For example, the layer 230 may consist of printed Cytop (Asahi Glass) onto which a layer of UV curable polymer is printed. Cytop has a low dielectric constant, but the surface is very hydrophobic. Therefore it is difficult to print a material such as silver ink onto Cytop. A UV curable polymer or another phase-change material may be printed onto a hydrophobic surface. Since this material may have a higher surface energy, printing onto the material becomes feasible. Examples of UV curable inkjet printable materials include the HexiFlex inks from Hexion Specialty Chemicals of Columbus, Ohio. Another example includes the UV curable coating materials from Performance Coatings International of West Caldwell, N.J. Moreover, the materials may contain catalysts, such as Palladium particles, or reducing agents, such as polyphenols (e.g., catechols such as polydopamine) to allow electroless plating of metals onto their surface. Multiple layers of such conductor and/or insulator structures may be deposited or printed.

Figure 3:
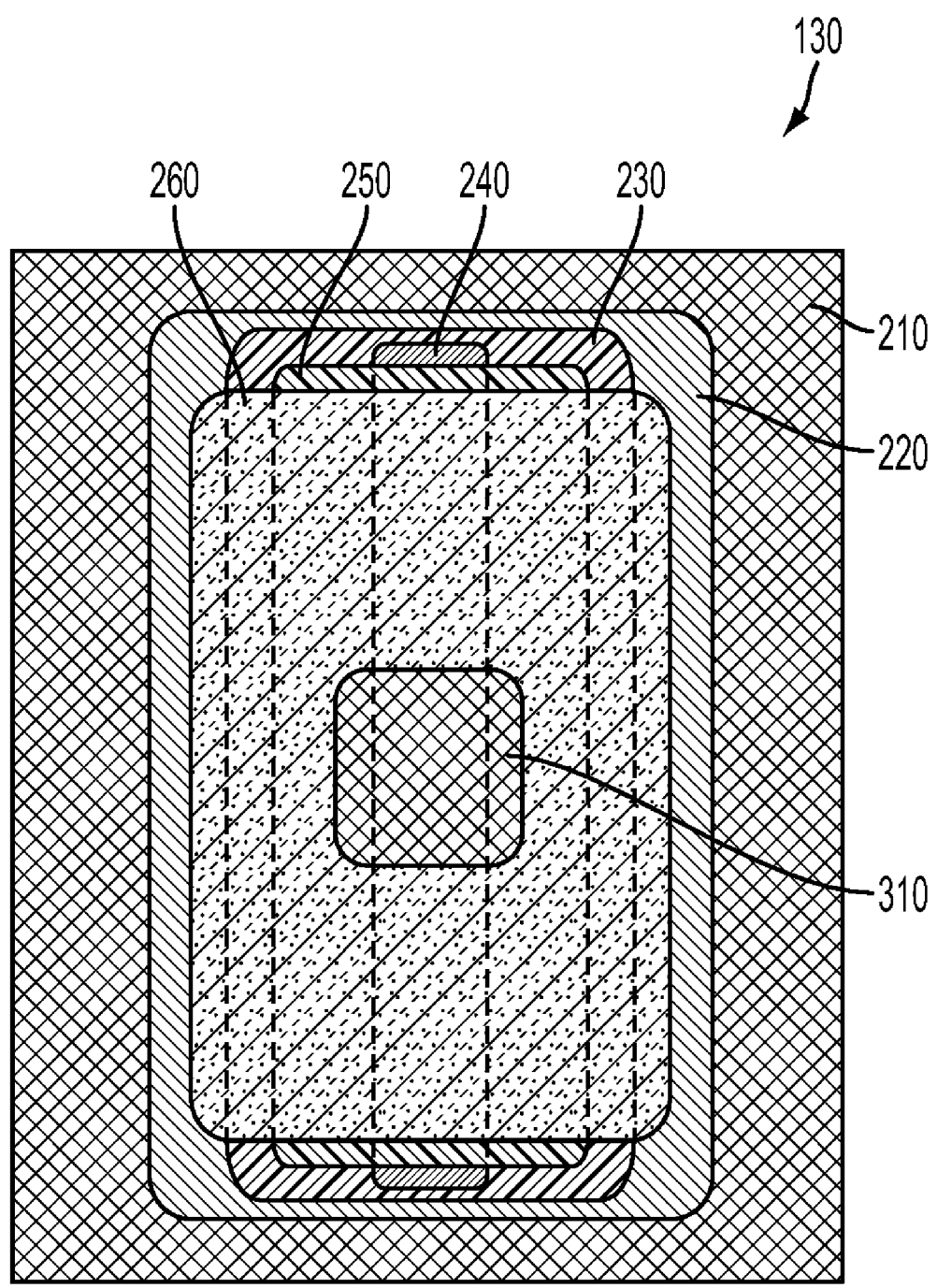
FIG. 3 is a diagram illustrating top view of the printed shielded cable according to one embodiment.

FIG. 3 is a diagram illustrating top view of the printed shielded cable 130 shown in FIG. 1 according to one embodiment.

The layers 220, 230, 240, 250, and 260 may have any suitable dimensions. Their length is typically dictated by the connection length. In one embodiment, their thickness may be more than one nanometer (nm) and less than one hundred micrometers ($\mu$m). In other embodiments, the insulating layers may be thicker and may be as thick as several hundred micrometers up to 1 mm. In one embodiment, their width may be more than one micrometer and less than one centimeter. In other embodiments, a shielded cable may be wider and the width may extend over several centimeters. For example, a shielded cable may carry many data lines which are arranged in parallel. Depending on the number of data lines, the width of the cable may not have an upper limit. As shown, the width of the layer 220 is the largest, followed by layer 260, 230, 250, and 240, in that order.

Active elements may also be included in the printed shielded cable. For example, a semiconductor 310, such as a polymer semiconductor may be included to act as a switch. The switch may be used to control or modulate the transmission of the sensing signal. The semiconductor 310 may be formed by a gate, a source, and a drain. The layer 220 may serve as a gate while the two end regions of the layer 240 may serve as source and drain of a transistor. The conductivity of the semiconductor 310 may be modulated or controlled by the voltages applied at the gate, source, or drain regions. The thickness of the insulator layer 230 and/or 250 may be thinner in the region of the semiconductor 310 to serve as a gate dielectric. The insulator layer 230 and/or 250 may locally include a different material with a higher dielectric constant. Jet printing allows the flexibility of varying the type of material or the thickness of the layer; for example, by printing more or fewer layers.

Figure 4:
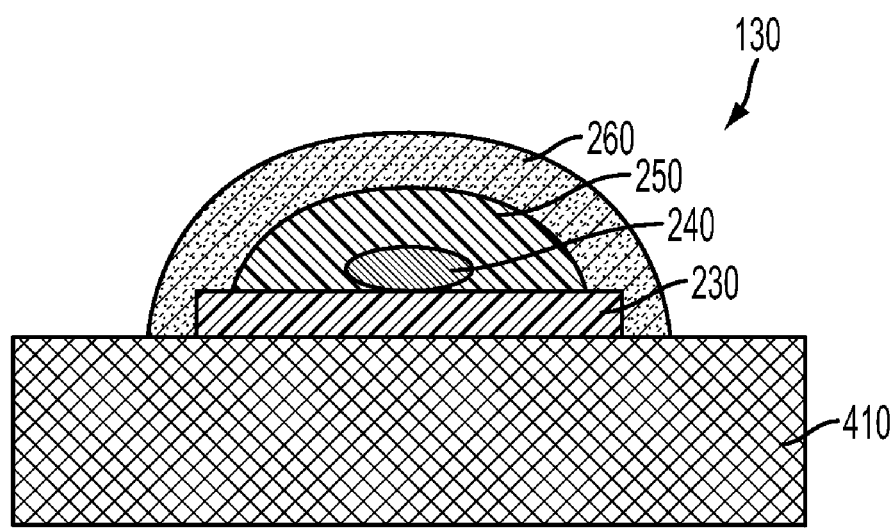
FIG. 4 is a diagram illustrating cross section of a printed shielded cable with conductive substrate according to one embodiment.

FIG. 4 is a diagram illustrating cross section of the printed shielded cable 130 shown in FIG. 1 with conductive substrate according to one embodiment. The embodiment in FIG. 4 is similar to the embodiment shown in FIG. 2 except that the substrate itself may be part of the shielding structure. In this case, the substrate 210 of FIG. 2 is replaced by a conductive substrate 410.

The conductive substrate 410 may be made of a conductive material, such as stainless steel. It may play the role of the first conductor layer 220 as shown in FIG. 1. The conductor layer 260 may be printed or solution deposited. It may be spin-coated, dip-coated, extrusion coated, or spray coated to uniformly cover the entire area.

Figure 5:
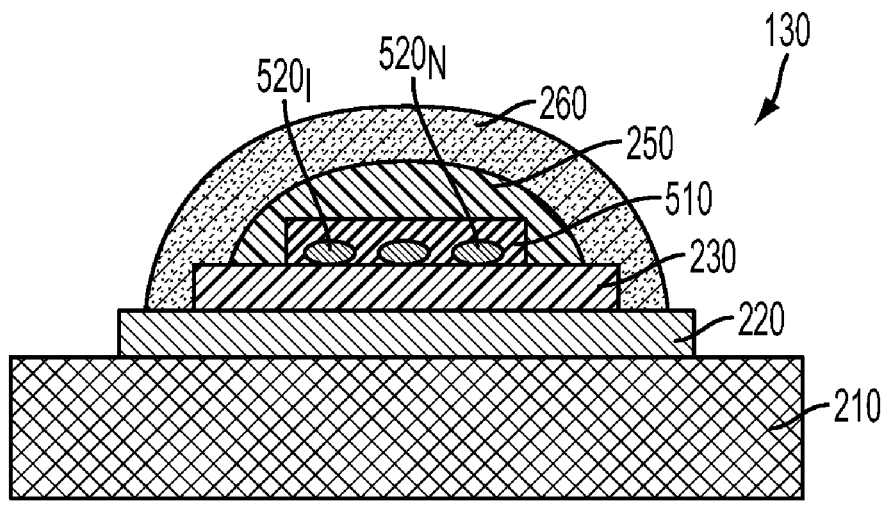
FIG. 5 is a diagram illustrating cross section of a printed shielded cable with shielded region containing multiple components according to one embodiment.

FIG. 5 is a diagram illustrating cross section of the printed shielded cable 130 shown in FIG. 1 with shielded region containing multiple components according to one embodiment. The embodiment shown in FIG. 5 is similar to the embodiment shown in FIG. 2 except that the insulator layer 250 defines a shield region 510 that may contain a single or multiple components $520_1$ to $520_N$. The single component or a component of the $520_1$ to $520_N$ may be any suitable component. It may be an active component (e.g., transistors, switching devices). It may be an optical component such as light emitting diode, optical sensor (e.g., for optical isolation), a micromechanical relay switch, an electrical filter element, etc. The components $520_1$ to $520_N$ may include a combination of conductive layers and active components.

Figure 6:
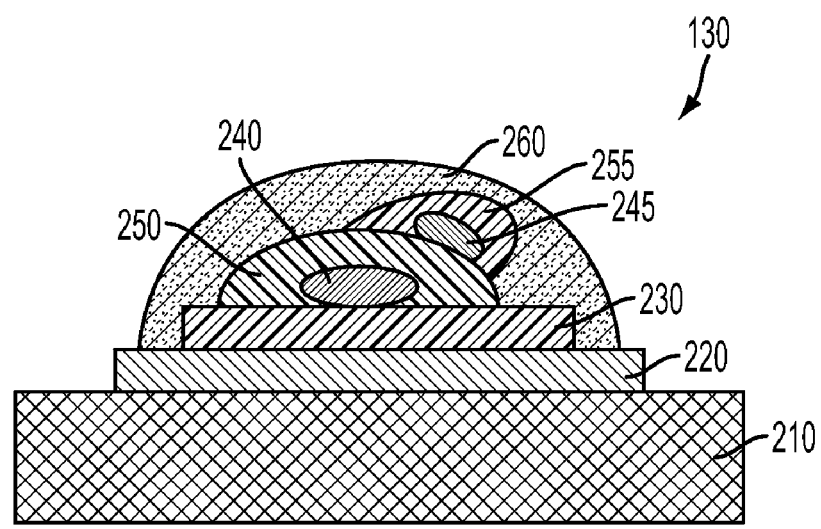
FIG. 6 is a diagram illustrating cross section of a printed shielded cable as a twinax shielded cable according to one embodiment.

FIG. 6 is a diagram illustrating cross section of the printed shielded cable 130 shown in FIG. 1 as a twinax shielded cable according to one embodiment. The embodiment shown in FIG. 6 is similar to the embodiment shown in FIG. 2 except that there are two additional layers 245 and 255 covered or encapsulated by the layer 260.

The layer 245 is a conductor or semiconductor layer deposited on the insulator layer 250. The layer 255 is an insulator layer deposited on the insulator layer 250 and covers, or encapsulates, the layer 245. The layers 245 and 255 may be deposited by printing. This embodiment provides for two shielded conductors in the same footprint.

Figure 7:
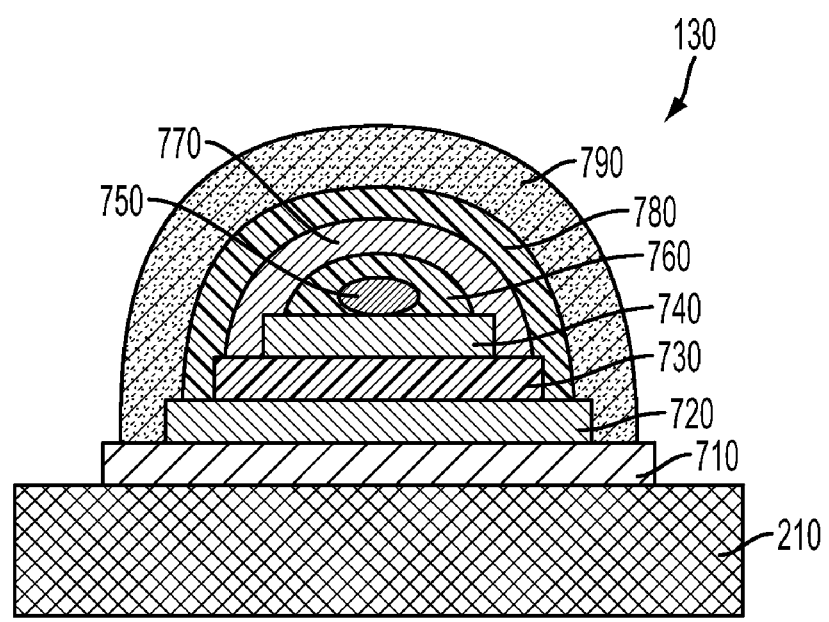
FIG. 7 is a diagram illustrating cross section of a printed shielded cable as a triax shielded cable according to one embodiment.

FIG. 7 is a diagram illustrating cross section of the printed shielded cable 130 shown in FIG. 1 as a triax shielded cable according to one embodiment. The embodiment in FIG. 7 is an extension from the embodiment in FIG. 2 in that there are additional shielding layers. The triax shielded cable includes the substrate 210; conductor or semiconductor layers 710, 730, 750, 770, and 790; and insulator layers 720, 740, 760, and 780. The depositing of the layers 710, 720, 730, 740, 750, 760, 770, 780, and 790 is similar to the depositing methods in the embodiment shown in FIG. 2. At least one of these layers is deposited by a printing technique. The materials of the conductor or semiconductor layers 710, 730, 750, 770, and 790; and the insulator layers 720, 740, 760, and 780 are also similar to the materials of the conductor or semiconductor and insulator layers shown in FIG. 2.

Figure 8:
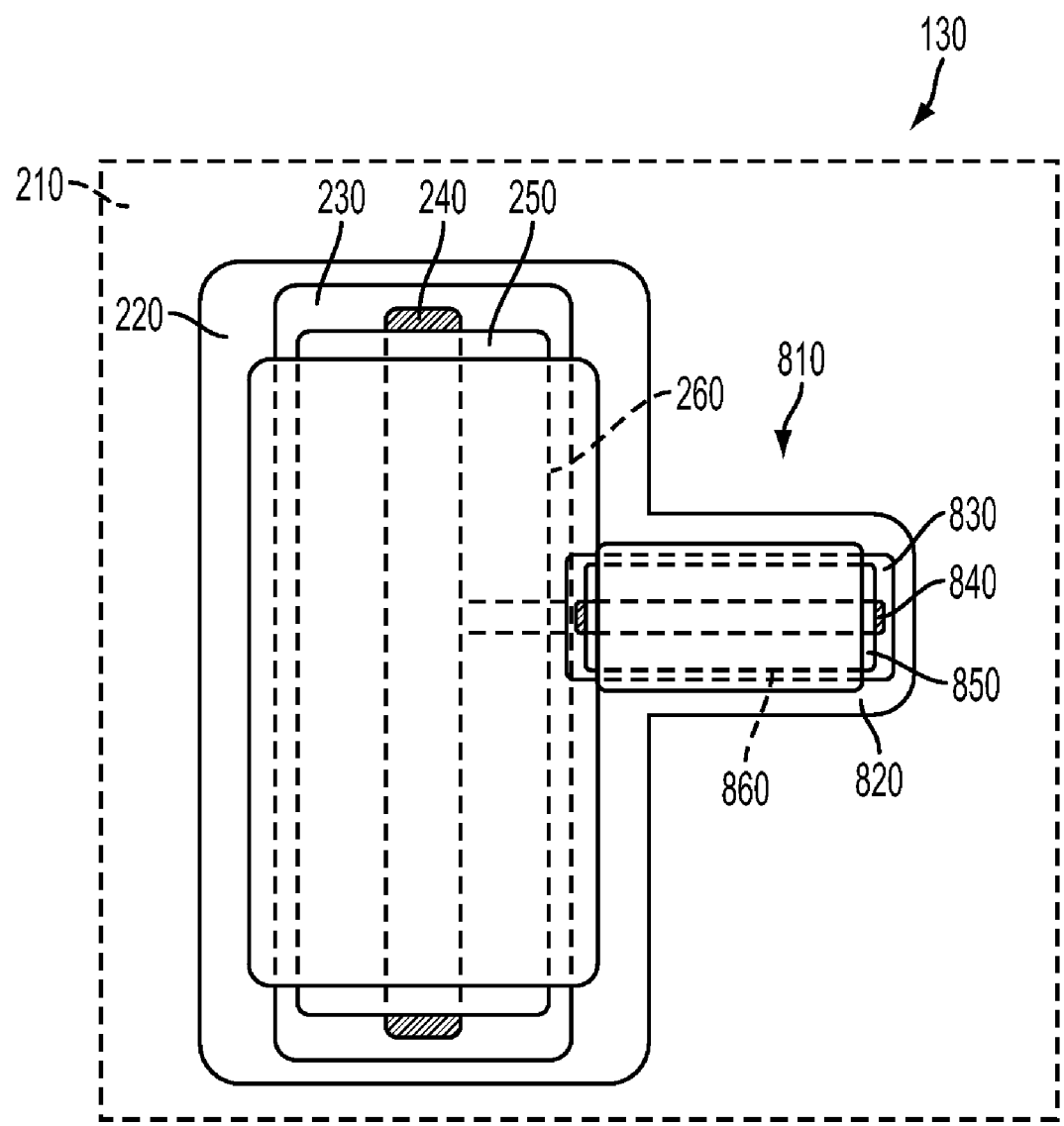
FIG. 8 is a diagram illustrating top view of a printed shielded cable with a branch-connection according to one embodiment.

FIG. 8 is a diagram illustrating top view of the printed shielded cable 130 shown in FIG. 1 with a branch-connection according to one embodiment. The printed shielded cable 130 includes two segments or branches that are connected via a branch-connection. The branch-connected shielded cable 810 is similar to the shielded cable shown in FIG. 2. The branch-connected shielded cable 810 includes conductor or semiconductor layers 820, 840, and 860; and insulator layers 830 and 850. The conductor or semiconductor layers 820, 840, and 860 are similar to the conductor or semiconductor layers 220, 240, and 260, respectively. The insulator layers 830 and 850 are similar to the insulator layers 230 and 250.

FIG. 8 illustrates an example of interconnection of the shield printed cables. The geometry of the connection may be any suitable connection (e.g., T-connection, Y-connection, V-connection). Any connection that forms an angle between the main cable and the connecting cable may be possible. In addition, multiple branches are possible.

Figure 9:
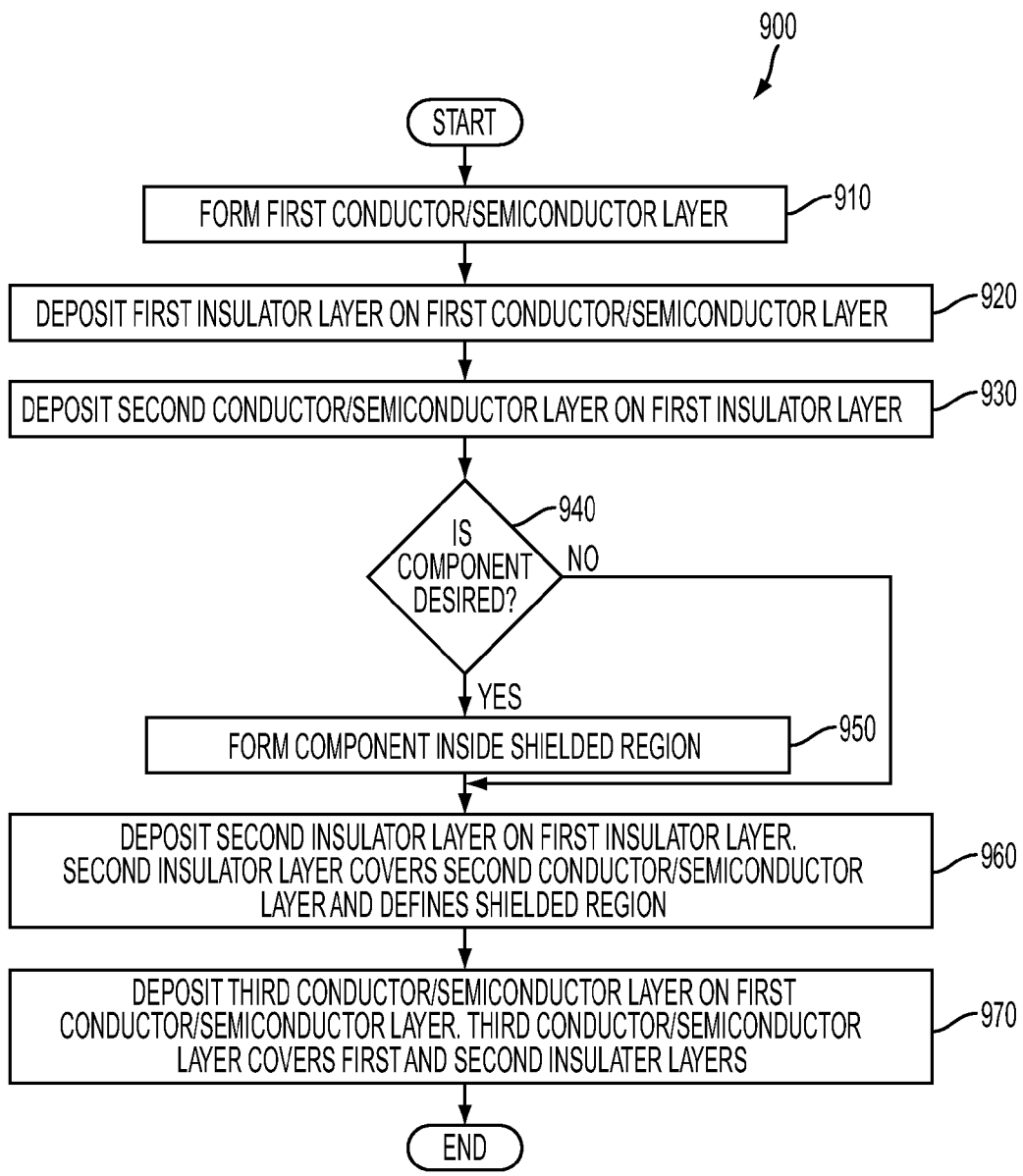
FIG. 9 is a flowchart illustrating a process to construct a printed shielded cable according to one embodiment.

FIG. 9 is a flowchart illustrating a process 900 to construct a shielded cable according to one embodiment.

Upon START, the process 900 forms a first conductor or semiconductor layer (Block 910). In one embodiment, the process 900 forms the first conductor or semiconductor layer on a substrate. In another embodiment, the process 900 forms the first conductor layer as part of the shielded structure without a substrate. The first conductor layer is a conductive substrate made of conductive material such as stainless steel.

Next, the process 900 deposits a first insulator layer on the first conductor or semiconductor layer (Block 920). Then, the process 900 deposits a second conductor or semiconductor layer on the first insulator layer (Block 930). The second conductor or semiconductor layer is encapsulated or covered in a shielded region.

Next, the process 900 determines if it is desired to include additional component in the shielded region (Block 940). If not, the process 900 proceeds to block 960. Otherwise, the process 900 forms a component inside the shielded region (Block 950). Then, the process 900 deposits a second insulator layer on the first insulator layer (Block 960). The second insulator layer covers, or encapsulates, the second conductor or semiconductor layer and defines the shielded region. Next, the process 900 deposits a third conductor or semiconductor layer on the first conductor or semiconductor layer (Block 970). The third conductor or semiconductor layer covers, or encapsulates, the first and second insulator layers. The process 900 is then terminated.

It will be appreciated that various of the above-disclosed and other features and functions, or alternatives thereof, may be desirably combined into many other different systems or applications. Various presently unforeseen or unanticipated alternatives, modifications, variations, or improvements therein may be subsequently made by those skilled in the art which are also intended to be encompassed by the following claims.

What is claimed is:

1. An apparatus comprising:
   a first conductor or semiconductor layer;
   a first insulator layer deposited on the first conductor or semiconductor layer;
   a second conductor or semiconductor layer deposited on the first insulator layer;
   a second insulator layer deposited on the first insulator layer and covering the second conductor or semiconductor layer, the second insulator layer defining a shielded region; and
   a third conductor or semiconductor layer deposited on the first conductor or semiconductor layer and encapsulating the first and second insulator layers;
   wherein at least one of the first, second, and third conductor or semiconductor layers, and the first and second insulator layers is deposited by printing, and
   wherein one of the first and second conductor or semiconductor layers is a gate and the third conductor or semiconductor layer includes a source and drain of a transistor device.

2. The apparatus of claim 1 wherein the first conductor or semiconductor layer is a conductive substrate.

3. The apparatus of claim 1 wherein the first conductor or semiconductor layer is deposited on a substrate.

4. The apparatus of claim 1 wherein at least one of the first, second, and third conductor or semiconductor layers, and the first and second insulator layer is deposited by inkjet printing.

5. The apparatus of claim 1 wherein at least one of the first, second, and third conductor or semiconductor layers is made of a printed conductor.

6. The apparatus of claim 1 wherein at least one of the first and second insulator layers is made from one of printed polymer solutions, printed polymer particles, precursors for inorganic insulators, silicones, polysilsesquioxanes, inorganic particles, hybrid organic-inorganic insulators, and a piezoelectric polymer.

7. The apparatus of claim 6 wherein the printed conductor is made of one of polyacetylene, polyaniline, a polymer mixture of two ionomers, sintered metal nanoparticles, a metal precursor, carbon nanotubes, metal nanowires, and a printed seed material for plating.

8. The apparatus of claim 1 wherein the shielded region further comprises an active component.

9. The apparatus of claim 8 wherein the active component is an electrical component or an optical component.

10. The apparatus of claim 1 wherein at least one of the first and second insulator layers is a piezoelectric polymer.

11. The apparatus of claim 10 wherein at least one of the first and second insulation layers includes a curable polymer.

12. An apparatus comprising:
   a first conductor or semiconductor layer;
   a first insulator layer deposited on the first conductor or semiconductor layer;
   a second conductor or semiconductor layer deposited on the first insulator layer;
   a second insulator layer deposited on the first insulator layer and covering the second conductor or semiconductor layer, the second insulator layer defining a shielded region; and
   a third conductor or semiconductor layer deposited on the first conductor or semiconductor layer and encapsulating the first and second insulator layers;

wherein at least one of the first, second, and third conductor or semiconductor layers, and the first and second insulator layers is deposited by printing a fourth conductor or semiconductor layer deposited on the second insulator layer; and a third insulator layer deposited on the second insulator layer and covering the fourth conductor or semiconductor layer, the third insulator layer being within the third conductor or semiconductor layer.

13. The apparatus of claim 1 further comprising:
a branch-connection to accommodate a shielded assembly.

14. A method comprising:
forming a first conductor or semiconductor layer;
depositing a first insulator layer on the first conductor or semiconductor layer;
depositing a second conductor or semiconductor layer on the first insulator layer;
depositing a second insulator layer on the first insulator layer, the second insulator layer covering the second conductor or semiconductor layer and defining a shielded region; and
depositing a third conductor or semiconductor layer on the first conductor or semiconductor layer, the third conductor or semiconductor layer encapsulating the first and second insulator layers;
wherein at least one of the first, second, and third conductor or semiconductor layers, and the first and second insulator layers is deposited by printing, and
wherein one of the first and second conductor or semiconductor layers is a gate and the third conductor or semiconductor layer includes a source and drain of a transistor device.

15. The method of claim 14 wherein the first conductor or semiconductor layer is a conductive substrate.

16. The method of claim 14 wherein the first conductor or semiconductor layer is deposited on a substrate.

17. The method of claim 14 wherein at least one of the first, second, and third conductor or semiconductor layers, and the first and second insulator layers is printed by inkjet printing.

18. The method of claim 14 wherein at least one of the first, second, and third conductor or semiconductor layers is made of a printed conductor.

19. The method of claim 18 wherein the printed conductor is made of one of polyacetylene, polyaniline, a polymer mixture of two ionomers, sintered metal nanoparticles, a metal precursor, carbon nanotubes, metal nanowires, and a printed and plated seed material.

20. The method of claim 14 wherein at least one of the first and second insulator layers is made from one of printed polymer solutions, printed polymer particles, precursors for inorganic insulators, silicones, polysilsesquioxanes, inorganic particles, hybrid organic-inorganic insulators, and a piezoelectric polymer.

21. The method of claim 14 further comprising forming an active component inside the shielded region.

22. A circuit comprising:
a sensor to generate a sensing signal;
an input circuit to read the sensing signal; and
a shielded cable connecting the sensor to the input circuit, the shielded cable comprising:
a first conductor or semiconductor layer,
a first insulator layer deposited on the first conductor or semiconductor layer,
a second conductor or semiconductor layer deposited on the first insulator layer,
a second insulator layer deposited on the first insulator layer and covering the second conductor or semiconductor layer, the second insulator layer defining a shielded region, and
a third conductor or semiconductor layer deposited on the first conductor or semiconductor layer and encapsulating the first and second insulator layers;
wherein at least one of the first, second, and third conductor or semiconductor layers, and the first and second insulator layers is deposited by printing, and
wherein one of the first and second conductor or semiconductor layers is a gate and the third conductor or semiconductor layer includes a source and drain of a transistor device.

23. The circuit of claim 22 wherein the first conductor or semiconductor layer is a conductive substrate.

24. The circuit of claim 22 wherein the first conductor or semiconductor layer is deposited on a substrate.

* * * * *